(12) United States Patent
Park

(10) Patent No.: US 11,621,233 B2
(45) Date of Patent: *Apr. 4, 2023

(54) SEMICONDUCTOR PACKAGE INCLUDING AN ELECTROMAGNETIC SHIELD AND METHOD OF FABRICATING THE SAME

(71) Applicant: SAMSUNG ELECTRONICS CO., LTD., Suwon-si (KR)

(72) Inventor: Youngwoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/453,225

(22) Filed: Nov. 2, 2021

(65) Prior Publication Data

US 2022/0059470 A1 Feb. 24, 2022

Related U.S. Application Data

(63) Continuation of application No. 16/711,065, filed on Dec. 11, 2019, now Pat. No. 11,183,466.

(30) Foreign Application Priority Data

May 28, 2019 (KR) .................. 10-2019-0062815

(51) Int. Cl.
| | | |
|---|---|---|
| *H01L 23/52* | (2006.01) | |
| *H01L 23/552* | (2006.01) | |
| *H01L 23/00* | (2006.01) | |
| *H01L 23/31* | (2006.01) | |
| *H01L 21/78* | (2006.01) | |
| *H01L 21/56* | (2006.01) | |
| *H01L 23/498* | (2006.01) | |

(52) U.S. Cl.
CPC ............ *H01L 23/552* (2013.01); *H01L 21/56* (2013.01); *H01L 21/78* (2013.01); *H01L 23/3128* (2013.01); *H01L 23/49838* (2013.01); *H01L 24/16* (2013.01); *H01L 2224/16227* (2013.01)

(58) Field of Classification Search
CPC ....... H01L 23/552; H01L 21/56; H01L 21/78; H01L 23/3128; H01L 23/49838; H01L 24/16

See application file for complete search history.

(56) References Cited

U.S. PATENT DOCUMENTS

| | | |
|---|---|---|
| 7,295,083 B2 | 11/2007 | Kimata et al. |
| 8,043,896 B2 | 10/2011 | Lee et al. |
| 8,410,584 B2 | 4/2013 | An et al. |
| 8,786,080 B2 | 7/2014 | Yen et al. |
| 9,831,197 B1 | 11/2017 | Yeh et al. |

(Continued)

FOREIGN PATENT DOCUMENTS

| | | |
|---|---|---|
| JP | 5235203 | 7/2013 |
| KR | 10-2020-0001083 | 1/2020 |

*Primary Examiner* — Nicholas J Tobergte
(74) *Attorney, Agent, or Firm* — F. Chau & Associates, LLC

(57) ABSTRACT

Disclosed are semiconductor packages and methods of fabricating the same. The method inluces forming a semiconductor chip, forming an electromagnetic shield that covers the semiconductor chip, and forming a molding that covers the electromagnetic shield. The electromagnetic shield is electrically connected to a conductor on a side of the semiconductor chip.

12 Claims, 25 Drawing Sheets

(56) References Cited

U.S. PATENT DOCUMENTS

| | | | |
|---|---|---|---|
| 10,008,454 B1 | 6/2018 | Ho | |
| 11,183,466 B2 * | 11/2021 | Park | H01L 24/20 |
| 2010/0187661 A1 | 7/2010 | Chen et al. | |
| 2010/0207258 A1 | 8/2010 | Eun et al. | |
| 2014/0203278 A1 * | 7/2014 | Ossimitz | H01L 22/32 |
| | | | 257/48 |
| 2014/0339888 A1 | 11/2014 | Gaddi et al. | |
| 2016/0262292 A1 | 9/2016 | Kuk et al. | |
| 2017/0290155 A1 | 10/2017 | Elsherbini et al. | |
| 2018/0182715 A1 | 6/2018 | Kim et al. | |
| 2019/0303163 A1 | 10/2019 | Park | |
| 2020/0381368 A1 | 12/2020 | Fark | |

\* cited by examiner

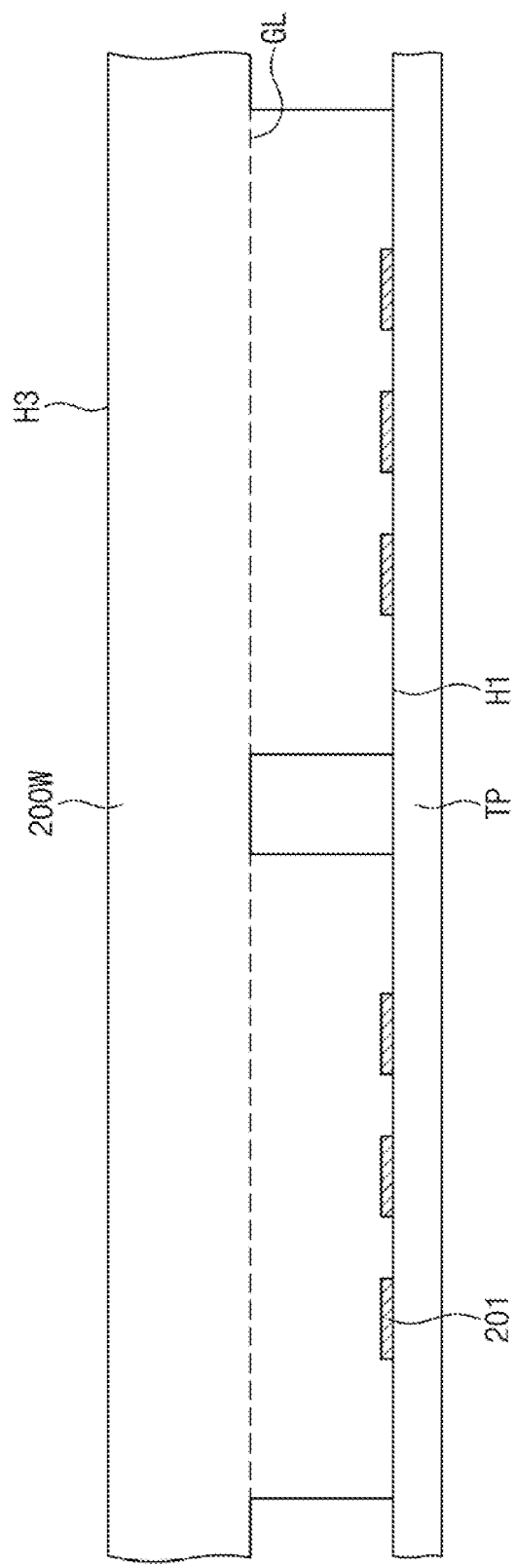

SEMICONDUCTOR PACKAGE INCLUDING AN ELECTROMAGNETIC SHIELD AND METHOD OF FABRICATING THE SAME

CROSS-REFERENCE TO RELATED APPLICATION

This U.S. nonprovisional application is a Continuation of co-pending U.S. patent application Ser. No. 16/711,065, filed on Dec. 11, 2019, which claims priority under 35 U.S.C § 119 to Korean Patent Application No. 10-2019-0062815, filed on May 28, 2019 in the Korean Intellectual Property Office, the entire contents of which are hereby incorporated by reference.

TECHNICAL FIELD

The present disclosure relates to a semiconductor package, and more particularly, to a semiconductor package including an electromagnetic shield and a method of fabricating the same.

DISCUSSION OF THE RELATED ART

Electromagnetic waves emitted from semiconductor packages may interfere with adjacent semiconductor devices and may cause those devices to generate noise and to malfunction. Electromagnetic shields may thus be installed on semiconductor packages to prevent this emission of electromagnetic waves.

SUMMARY

Exemplary embodiments of the present inventive concepts provide a semiconductor package including an electromagnetic shield member configured to effectively shield electromagnetic waves. Methods of fabricating the same are provided. These methods are capable of reducing cost associated with forming the electromagnetic shield.

According to some exemplary embodiments of the present inventive concepts, a semiconductor package includes a package substrate. A semiconductor chip is disposed on the package substrate. A plurality of connection terminals is disposed between the semiconductor chip and the package substrate. The connection terminals electrically connect the semiconductor chip to the package substrate. An electromagnetic shield member covers the semiconductor chip. A molding member covers the electromagnetic shield member. The electromagnetic shield member is electrically connected to a conductive member on the package substrate. The electromagnetic shield member has a thickness equal to or greater than 1.5 μm. The conductive member has a first width in a parallel direction to a top surface of the package substrate, the first width ranging from 50 μm to 100 μm. The conductive member also has a second width in a perpendicular direction to the top surface of the package substrate. The second width is the same as or greater than a width in the perpendicular direction of each of the connection terminals.

According to some exemplary embodiments of the present inventive concepts, a method of fabricating a semiconductor package includes forming a semiconductor chip. An electromagnetic shield member covers the semiconductor chip. A molding member is formed that covers the electromagnetic shield member. The electromagnetic shield member is electrically connected to a conductive member on a side of the semiconductor chip.

According to some exemplary embodiments of the present inventive concepts, a method of fabricating a semiconductor package includes forming an electromagnetic shield member on a top surface and lateral surfaces of a semiconductor chip. A molding layer is formed that covers the electromagnetic shield member. A redistribution layer is formed on an active surface of the semiconductor chip. The redistribution layer may be electrically connected to the electromagnetic shield member.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 5A to 5G are cross-sectional views illustrating a method of fabricating a semiconductor package according to some exemplary embodiments of the present inventive concepts;

DETAILED DESCRIPTION OF EMBODIMENTS

Figure 1A:
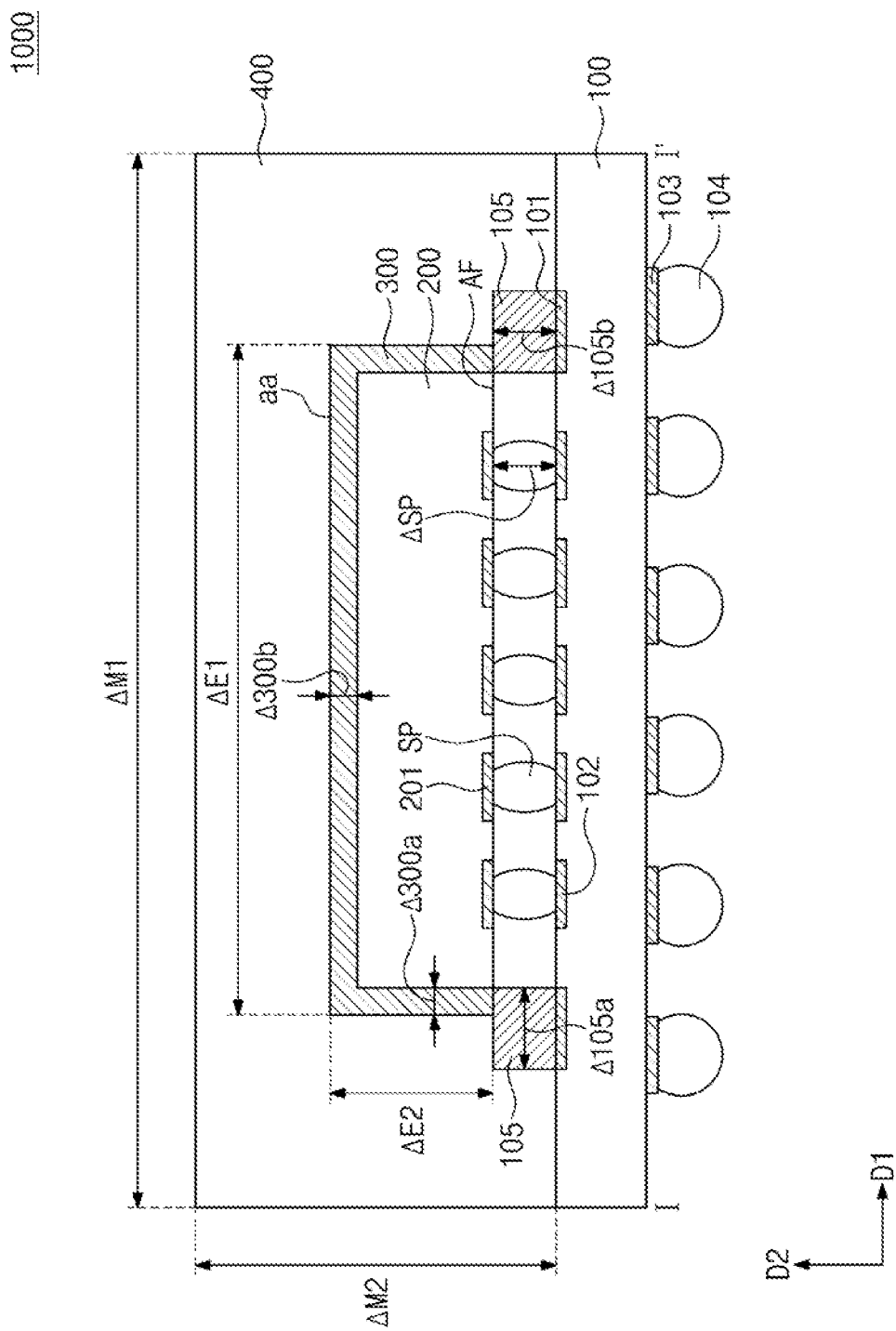
FIG. 1A is a cross-sectional view illustrating a semiconductor package according to some exemplary embodiments of the present inventive concepts.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 1B:
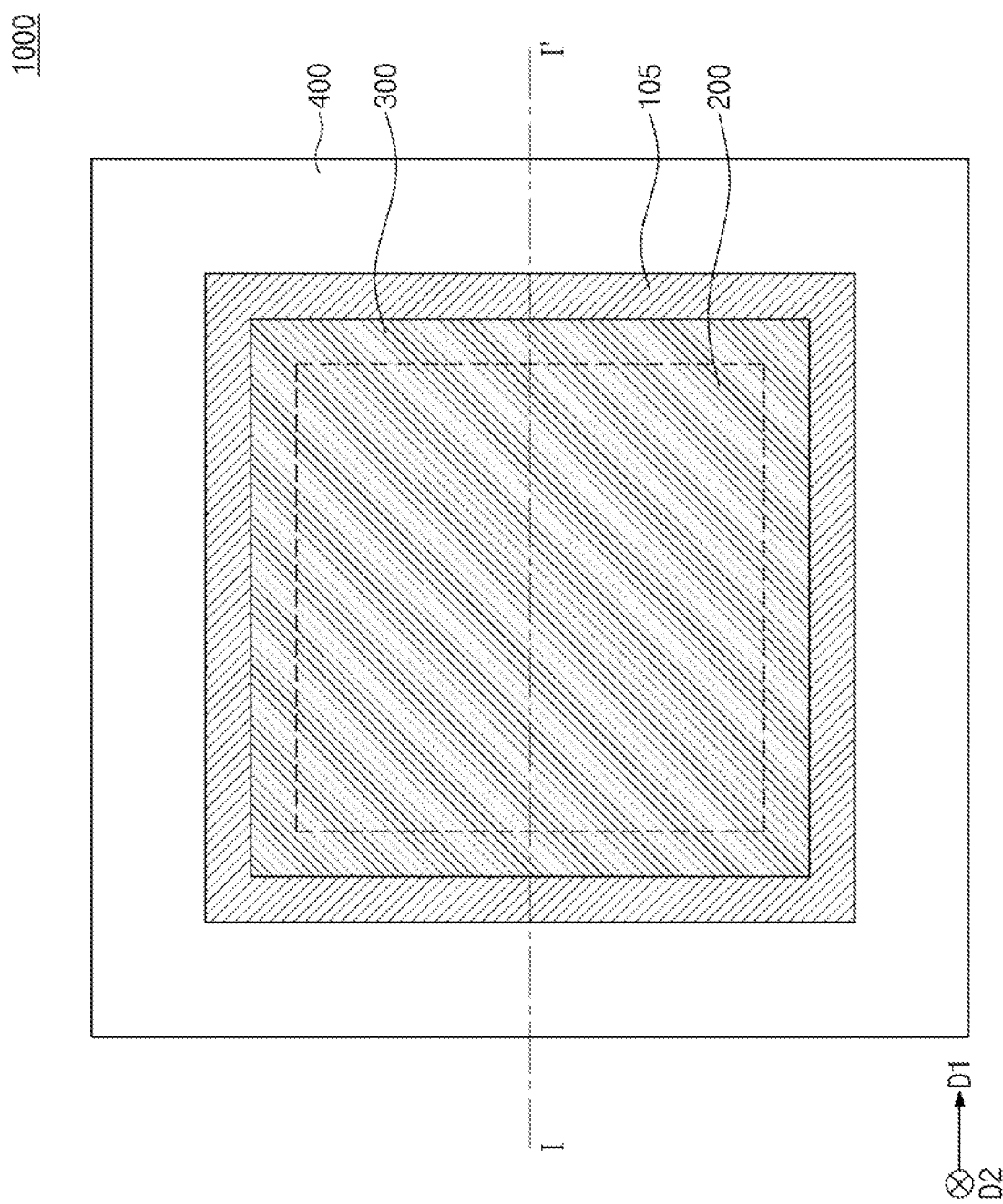
FIG. 1B is a plan view of FIG. 1A.

FIG. 1A is a cross-sectional view illustrating a semiconductor package according to some exemplary embodiments of the present inventive concepts. FIG. 1B is a plan view of FIG. 1A. In FIG. 1B. In FIG. 1B, some components that are illustrated in FIG. 1A have been omitted. However, it is to be understood that these omitted elements are part of the arrangement shown in FIG. 1B.

Referring to FIGS. 1A and 1B, a semiconductor package 1000, according to some exemplary embodiments of the present inventive concepts, may include a package substrate 100, a semiconductor chip 200 disposed on the package substrate 100, an electromagnetic shield member 300 that covers the semiconductor chip 200, and a molding member 400 that covers the electromagnetic shield member 300. The semiconductor chip 200 may be flip-chip bonded to the package substrate 100.

The package substrate 100 may be, for example, a printed circuit board (PCB). The package substrate 100 may include a conductive member 105, a plurality of first pads 101, a plurality of second pads 102, a plurality of third pads 103, a plurality of connection terminals SP, and a plurality of solder balls 104.

The conductive member 105 may be mounted on the package substrate 100. The conductive member 105 may have a dam shape that at least partially surrounds the semiconductor chip 200. The conductive member 105 may include an electrically conductive material. The conductive member 105 may include, for example, copper, gold, and/or silver.

The conductive member 105 may have a width $\Delta 105a$ in a first direction D1 that is parallel to a top surface of the package substrate 100. The width $\Delta 105a$ may range from 50 μm to 100 μm. The conductive member 105 may have a width $\Delta 105b$ in a second direction D2 that is perpendicular to the top surface of the package substrate 100. The which width $\Delta 105b$ may change based on a width $\Delta SP$ in the second direction D2 of each of the connection terminals SP. The width $\Delta 105b$ in the second direction D2 of the conductive member 105 may be the same as or greater than the width $\Delta SP$ in the second direction D2 of each of the connection terminals SP. The width $\Delta SP$ in the second direction D2 of each of the connection terminals SP may range, for example, from 60 μm to 70 μm. The first pads 101 may be disposed on an upper portion of the package substrate 100 and may be placed below the conductive member 105. The first pads 101 may be electrically connected to the conductive member 105. The first pads 101 may be in contact with the conductive member 105.

The second pads 102 may be disposed on the upper portion of the package substrate 100. The second pads 102 may be disposed below corresponding connection terminals SP.

The third pads 103 may be disposed on a bottom surface of the package substrate 100. According to exemplary embodiments, the third pads 103 may be disposed on a lower portion of the package substrate 100. The plurality of solder balls 104 may be disposed on corresponding bottom surfaces of the third pads 103.

The conductive member 105 may be electrically connected to a ground circuit in the package substrate 100 through one or more first pads 101 in contact with the conductive member 105. The ground circuit may be electrically connected to one or more of the solder balls 104.

The semiconductor chip 200 may include a plurality of chip pads 201 on an active surface AF thereof. The semiconductor chip 200 may be electrically connected to the package substrate 100 through the plurality of chip pads 201 and their corresponding connection terminals SP.

The semiconductor chip 200 may have a top surface whose level is higher than that of a top surface of the conductive member 105. The semiconductor chip 200 may have a bottom surface whose level is the same, or substantially the same, as that of the top surface of the conductive member 105. In some exemplary embodiments, the bottom surface of the semiconductor chip 200 may have a level that is lower than that of the top surface of the conductive member 105. The semiconductor chip 200 and the conductive member 105 might not overlap each other. In some exemplary embodiments, the semiconductor chip 200 may partially overlap the conductive member 105.

The electromagnetic shield member 300 may include an electrically conductive material. The electrically conductive material may include a metal, such as copper and/or silver. The electromagnetic shield member 300 may include a material that absorbs (and does not permit passage of) electromagnetic waves released from the semiconductor chip 200.

The electromagnetic shield member 300 may at least partially cover the semiconductor chip 200. For example, the electromagnetic shield member 300 may cover the top surface and lateral surfaces of the semiconductor chip 200. The electromagnetic shield member 300 may be in direct contact with the semiconductor chip 200.

On opposite sides of the semiconductor chip 200, at least a portion of the electromagnetic shield member 300 may overlap at least a portion of the conductive member 105. The electromagnetic shield member 300 on opposite lateral surfaces of the semiconductor chip 200 may be in contact with the conductive member 105.

The electromagnetic shield member 300 may be electrically connected to the conductive member 105. Electromagnetic waves absorbed into the electromagnetic shield member 300 from the semiconductor chip 200 may be directed through the conductive member 105 toward the ground circuit of the package substrate 100 and may thus be prevented from propagating beyond the electromagnetic shield member 300.

The electromagnetic shield member 300 may have a thickness $\Delta 300a$ in the first direction D1 and may also have a thickness $\Delta 300b$ in the second direction D2. The thickness $\Delta 300b$ in the second direction D2 may be the same as or greater than the thickness $\Delta 300a$ in the first direction D1. The thicknesses $\Delta 300a$ and $\Delta 300b$ in the first and second directions D1 and D2, respectively, may be at least 1.5 μm.

The molding member 400 may at least partially cover the electromagnetic shield member 300. The molding member 400 may include, for example, an epoxy molding compound (EMC).

The molding member 400 has a width $\Delta M1$ in the first direction D1. This width $\Delta M1$ may be greater than a width $\Delta E1$ in the first direction D1 of the electromagnetic shield member 300. The molding member 400 has a width $\Delta M2$ in the second direction D2. This width $\Delta M2$ may be greater than a width $\Delta E2$ in the second direction D2 of the electromagnetic shield member 300.

Figure 1C:
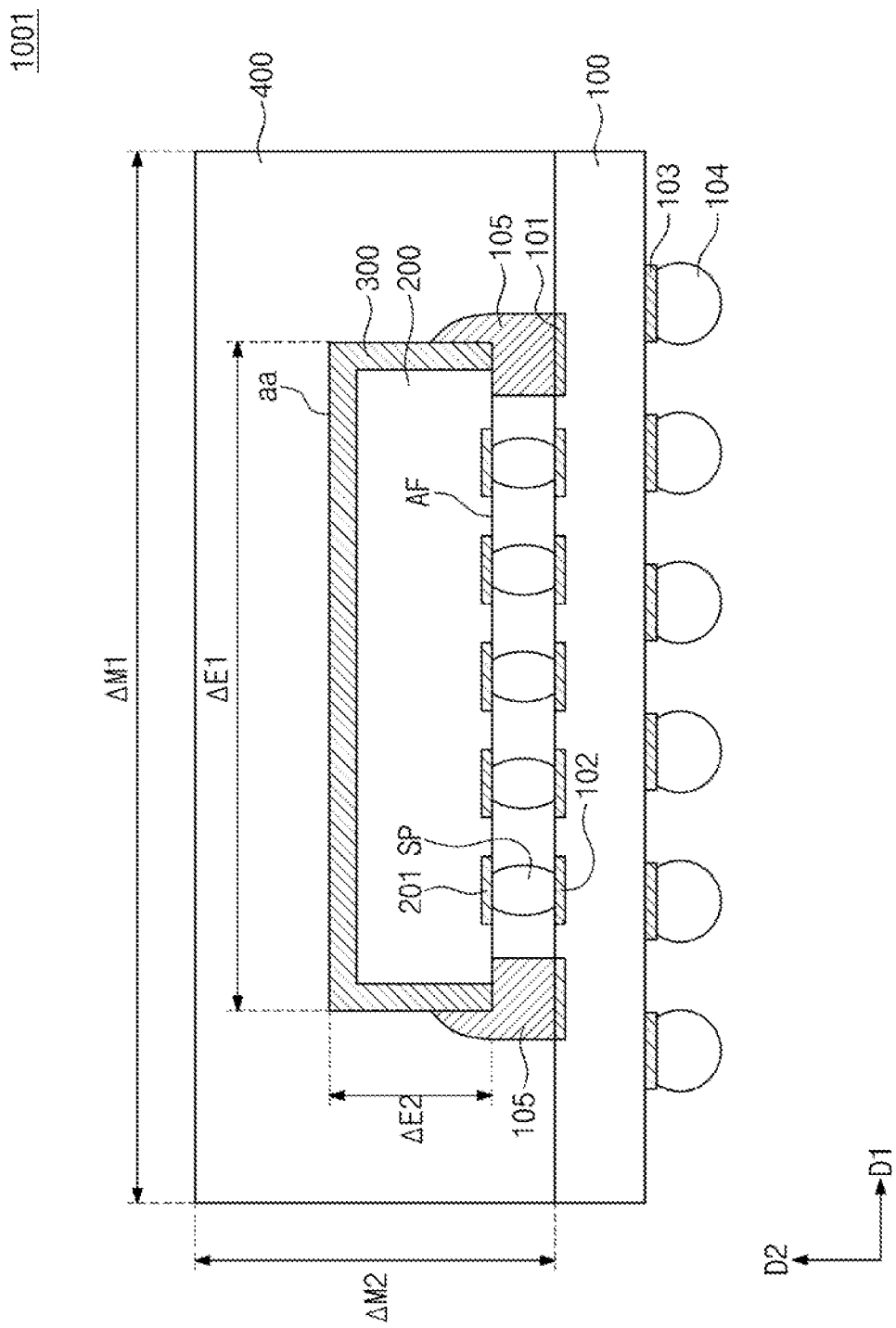
FIG. 1C is a cross-sectional view illustrating an example of a semiconductor package according to some exemplary embodiments of the present inventive concepts.

FIG. 1C is a cross-sectional view illustrating an example of a semiconductor package according to exemplary embodiments of the present inventive concepts. Except as discussed below, the present inventive concepts have been described in detail with reference to FIG. 1A, and thus it may be assumed that those elements not described with respect to FIG. 1C are at least similar to those elements that have been described with respect to FIG. 1A.

A semiconductor package 1001, according to some exemplary embodiments of the present inventive concepts, may be configured such that the bottom surface of the semiconductor chip 200 may be located at a lower level than that of the top surface of the conductive member 105. On opposite sides of the semiconductor chip 200, a portion of the electromagnetic shield member 300 may overlap a portion of the conductive member 105. The electromagnetic shield member 300, on opposite lateral surfaces of the semiconductor chip 200, may be in contact with the conductive member 105. A portion of the semiconductor chip 200 may overlap at least a portion of the conductive member 105.

FIGS. 2A to 2H illustrate cross-sectional views showing a method of fabricating a semiconductor package according to some exemplary embodiments of the present inventive concepts.

Figure 2A:
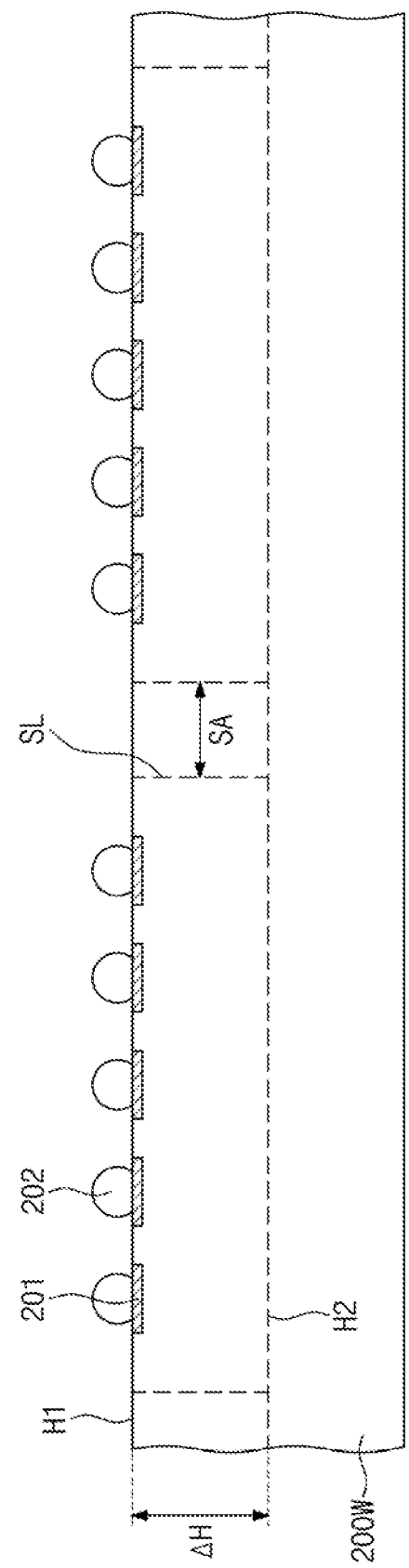
FIGS. 2A to 2H are cross-sectional views illustrating a method of fabricating a semiconductor package according to some exemplary embodiments of the present inventive concepts.
Figure 2B:
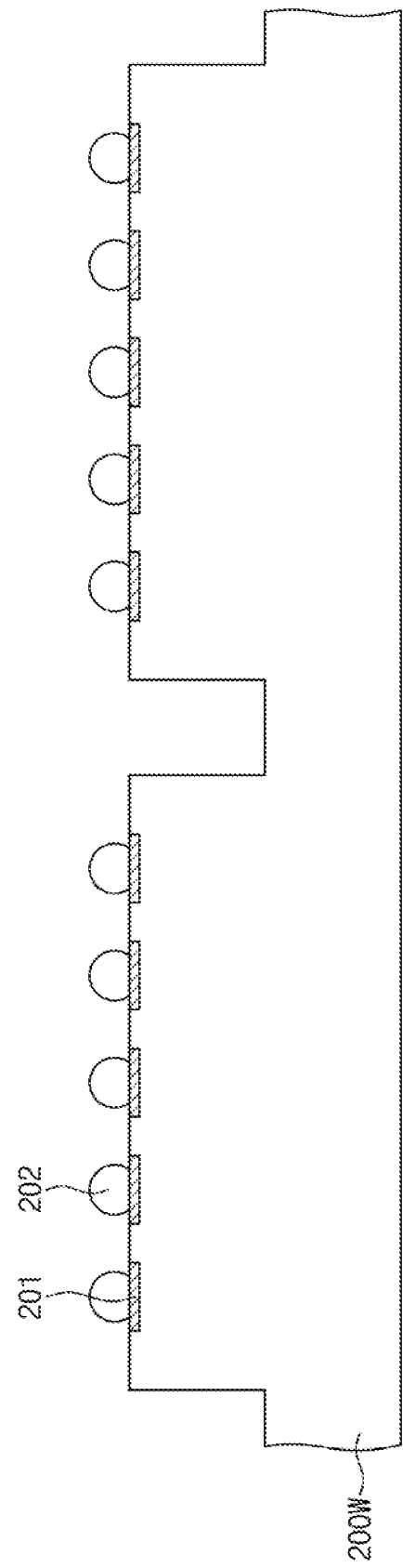

Referring to FIGS. 2A and 2B, sawing may be performed on a wafer 200W having a circuit formed on an upper portion thereof. The sawing may be performed along sawing lines SL. A plurality of bumps 202 may be provided on a top surface H1 of the wafer 200W. The wafer 200W may be provided on its upper portion with chip pads 201 that correspond to the bumps 202. The sawing SL may continue until is reached a certain depth H2 from the top surface H1 of the wafer 200W. A depth ΔH of the wafer 200W removed by the sawing SL may be, for example, about half of an overall thickness of the wafer 200W. The wafer 200W may have regions including a zone that is subsequently formed into a semiconductor chip 200 which will be discussed below, which regions exclude a sawing area SA of the wafer 200W removed by the sawing SL.

Figure 2C:
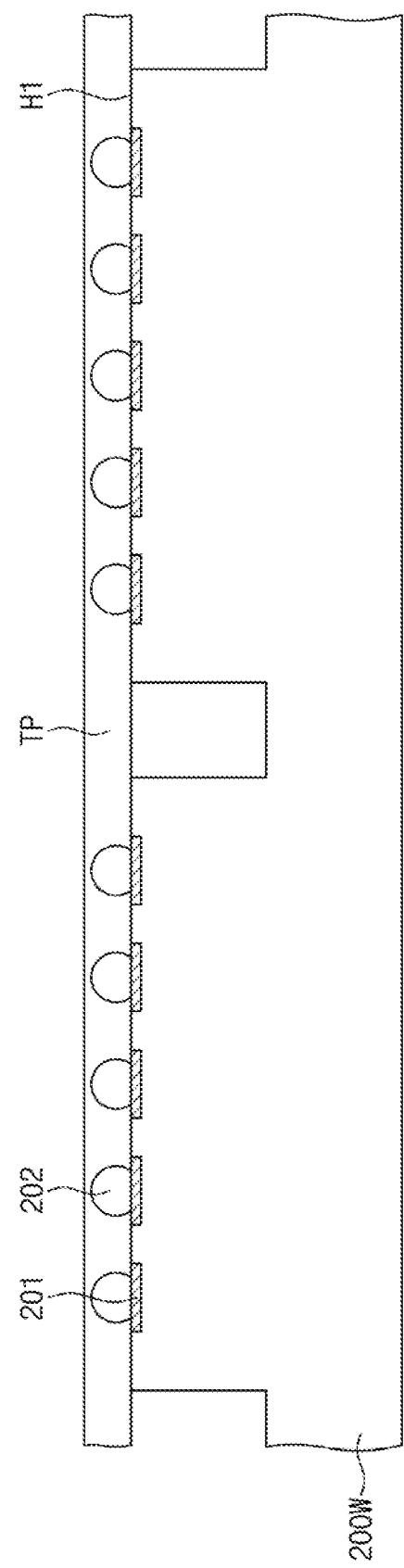

Referring to FIG. 2C, a protective tape TP may be attached to the top surface H1 of the wafer 200W. The protective tape TP may prevent damage to the upper portion of the wafer 200W, on which the circuit is formed, when a bottom surface of the wafer 200W is grinded as discussed below.

Figure 2D:
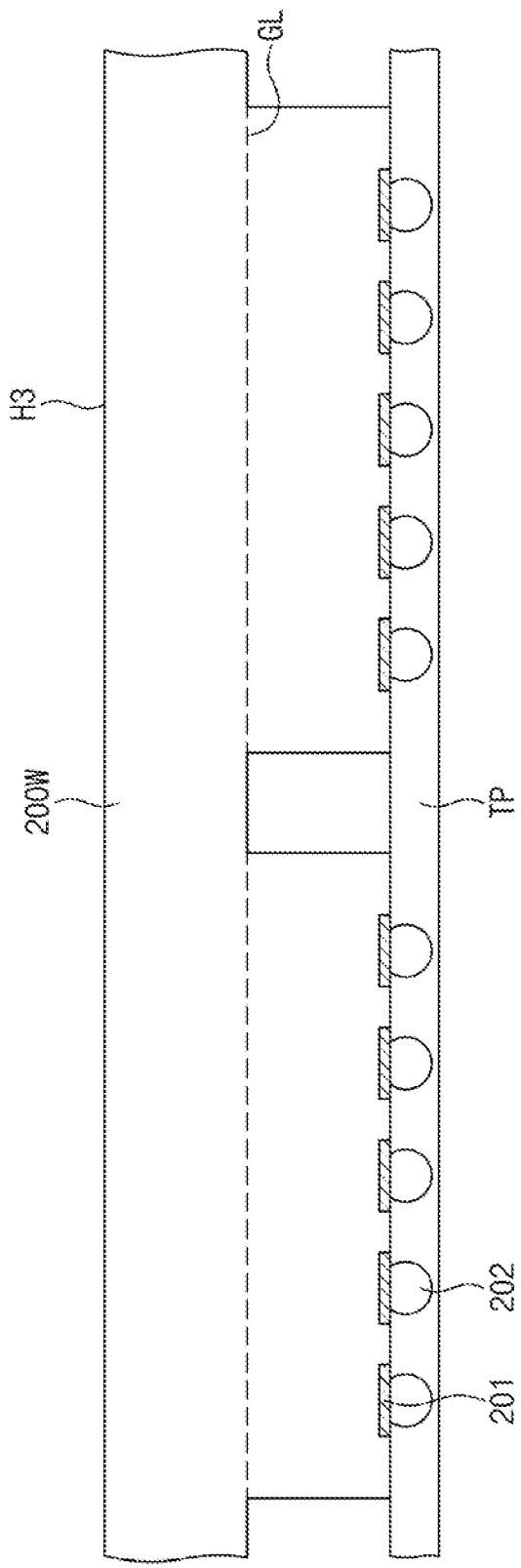
Figure 2E:
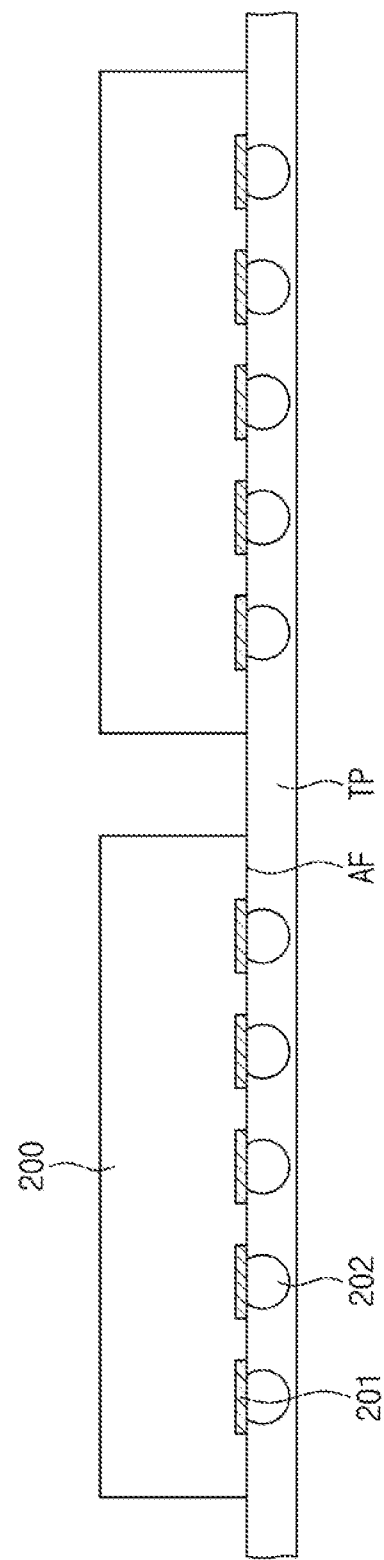

Referring to FIGS. 2D and 2E, a bottom surface H3 of the wafer 200W may be grinded to form a plurality of semiconductor chips 200. The grinding of the bottom surface H3 of the wafer 200W may reduce a thickness of the wafer 200W. The grinding may continue until a reference line GL along which the wafer 200W is divided into the plurality of semiconductor chips 200.

Figure 2F:
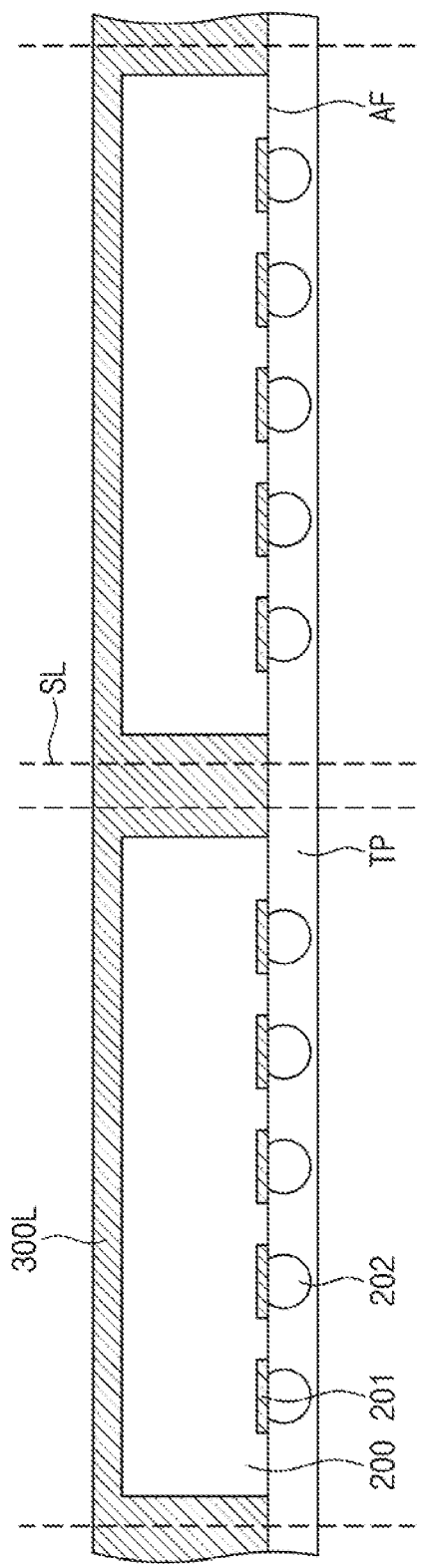

Referring to FIG. 2F, an electromagnetic shield material layer 300L may be formed on a top surface and on lateral surfaces of the semiconductor chip 200. The semiconductor chip 200 may be provided with the electromagnetic shield material layer 300L on each of its surfaces, except for an active surface AF of the semiconductor chip 200. The electromagnetic shield material layer 300L may connect adjacent semiconductor chips 200.

The electromagnetic shield material layer 300L may be deposited by, for example, a spray coating process, an electrolytic plating process, an electroless plating process, a sputtering process, and/or a physical vapor deposition (PVD) process. For example, a physical vapor deposition (PVD) process may be employed to deposit the electromagnetic shield material layer 300L. The electromagnetic shield material layer 300L may include a conductive material. The conductive material may include metal, such as copper and/or silver.

For example, sawing SL may be performed on the electromagnetic shield material layer 300L between adjacent semiconductor chips 200, and thus an electromagnetic shield member 300 may be formed. At the same time, the protective tape TP may be cut between the adjacent semiconductor chips 200. As a result, the semiconductor chip 200 may be covered with the electromagnetic shield member 300 on each of its surfaces other than the active surface AF. As discussed above, the electromagnetic shield member 300 may be formed in a wafer process step.

Figure 2G:
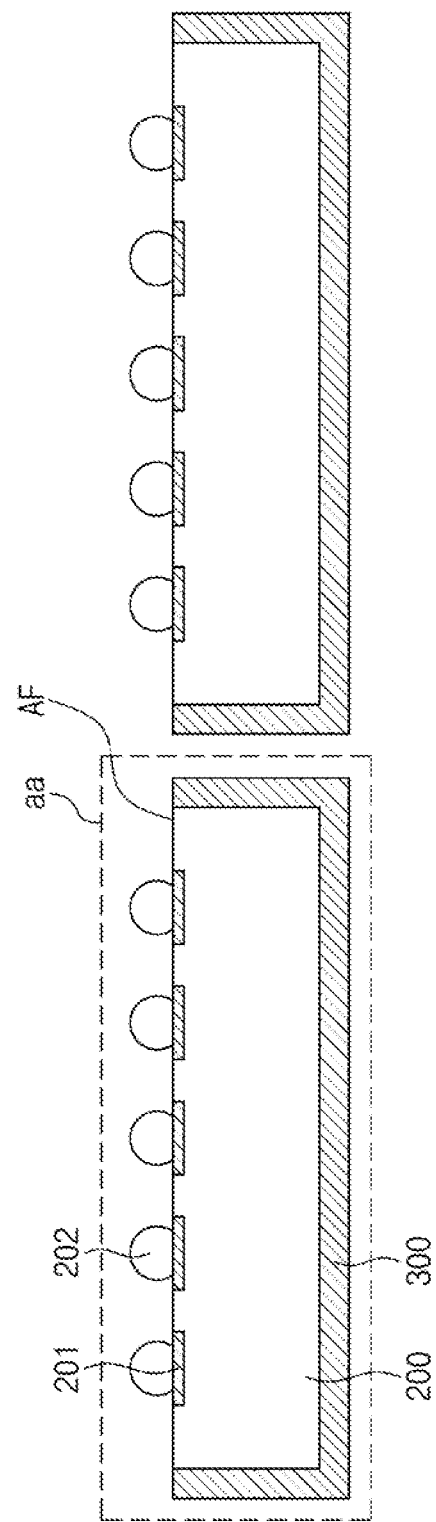

Referring to FIG. 2G, the semiconductor chips 200 may be disposed on a carrier substrate. The protective tape TP may be removed from the active surfaces AF of the semiconductor chips 200, such that a first semiconductor device aa may be formed.

Figure 2H:
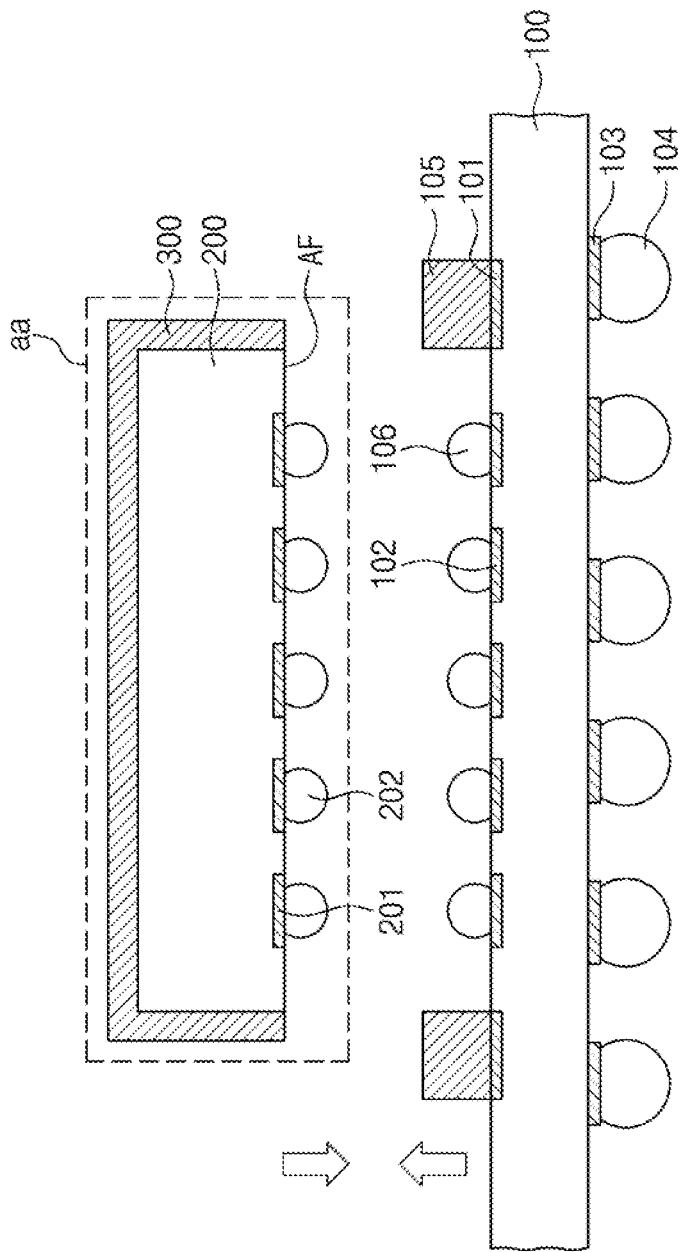

Referring to FIG. 2H, the first semiconductor device aa may be mounted on a package substrate 100 on which a conductive member 105 is mounted. The semiconductor chip 200 may be mounted so as to allow its active surface AF to face the package substrate 100.

The package substrate 100 may include a plurality of first pads 101, a plurality of second pads 102, a plurality of third pads 103, a plurality of bumps 106, and a plurality of solder balls 104.

The first pads 101 and the second pads 102 may each be disposed on an upper portion of the package substrate 100. The first pads 101 may be disposed so as to at least partially overlap the conductive member 105. The second pads 102 may be disposed so as to at least partially overlap corresponding bumps 106 on a top surface of the package substrate 100. The solder balls 104 may be disposed on a bottom surface of the package substrate 100. The third pads 103 may be disposed on a lower portion of the package substrate 100. The third pads 103 may be disposed so as to at least overlap corresponding solder balls 104.

A plurality of bumps 202 of the first semiconductor device aa may be disposed to align with the plurality of bumps 106 of the package substrate 100. On opposite sides of the semiconductor chip 200, at least a portion of the electromagnetic shield member 300 may overlap at least a portion of the conductive member 105.

Referring back to FIG. 1A, the bumps 202 of the first semiconductor device aa and the bumps 106 of the package substrate 100 may be reflowed to form connection terminals SP that connect the semiconductor chip 200 to the package substrate 100.

A molding member 400 may be formed to cover the electromagnetic shield member 300. The molding member 400 may be formed by forming a molding layer on the package substrate 100 and then performing a singulation process on the molding layer. The molding layer may include, for example, an epoxy molding compound (EMC).

FIGS. 3A to 3D illustrate cross-sectional views showing a method of fabricating a semiconductor package according to some exemplary embodiments of the present inventive concepts. Except as discussed below, the present inventive concepts have been described in detail with reference to FIGS. 2A to 2D, and thus further explanations will be omitted. It is to be understood that those elements that have been omitted may also be present in the arrangement shown in FIGS. 3A to 3D, and these elements may be at least similar to corresponding elements that have already been described.

Figure 3A:
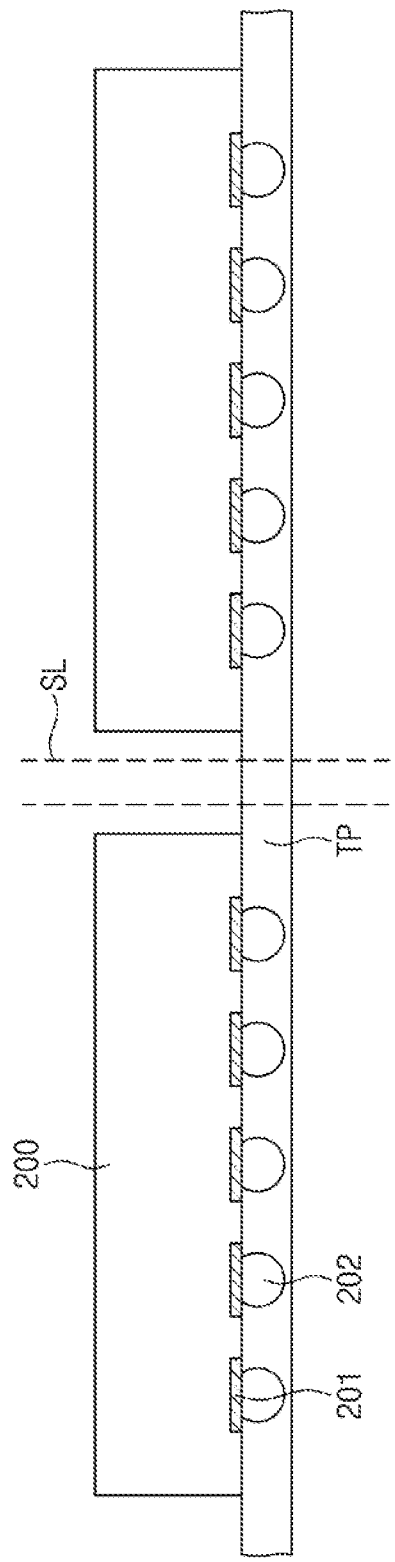
FIGS. 3A to 3D are cross-sectional views illustrating a method of fabricating a semiconductor package according to some exemplary embodiments of the present inventive concepts.

Referring to FIGS. 2D and 3A, a grinding process may be performed on the bottom surface H3 of the wafer 200W having the circuit formed on its upper portion, and a plurality of semiconductor chips 200 may thus be formed. The protective tape TP may be cut (e.g. severed) between adjacent semiconductor chips 200.

Figure 3B:
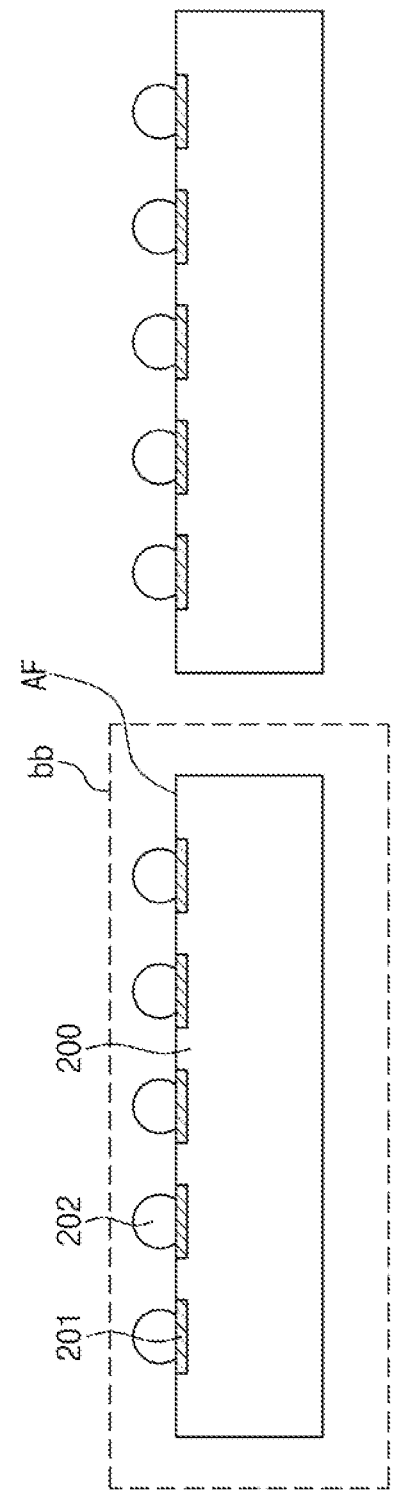

Referring to FIG. 3B, the semiconductor chips 200 may be disposed on a carrier substrate. The semiconductor chip 200 may be disposed so as to allow its active surface AF to face upwardly, and then the protective tape TP may be removed to form a second semiconductor device bb.

Figure 3C:
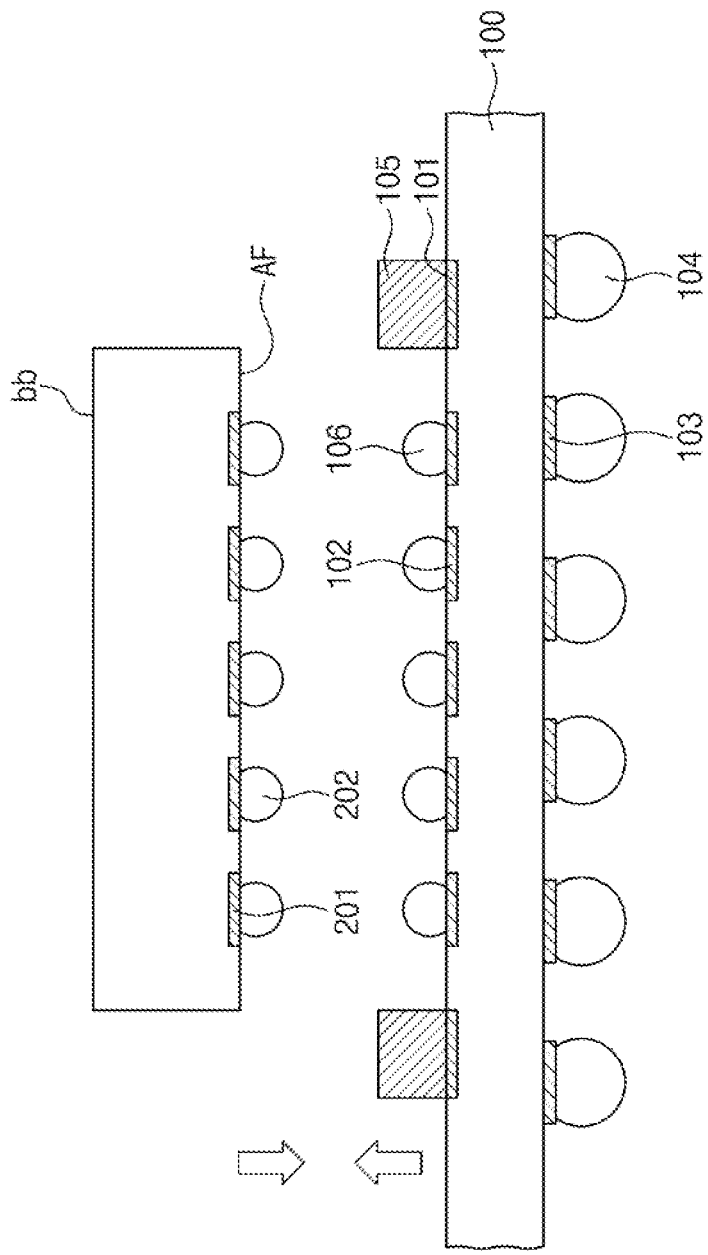

Referring to FIG. 3C, the second semiconductor device bb may be mounted on the package substrate 100 so as to allow the active surface AF of the second semiconductor device bb to face the package substrate 100. A plurality of bumps 202 of the second semiconductor device bb may be disposed to align with the plurality of bumps 106 of the package substrate 100.

Figure 3D:
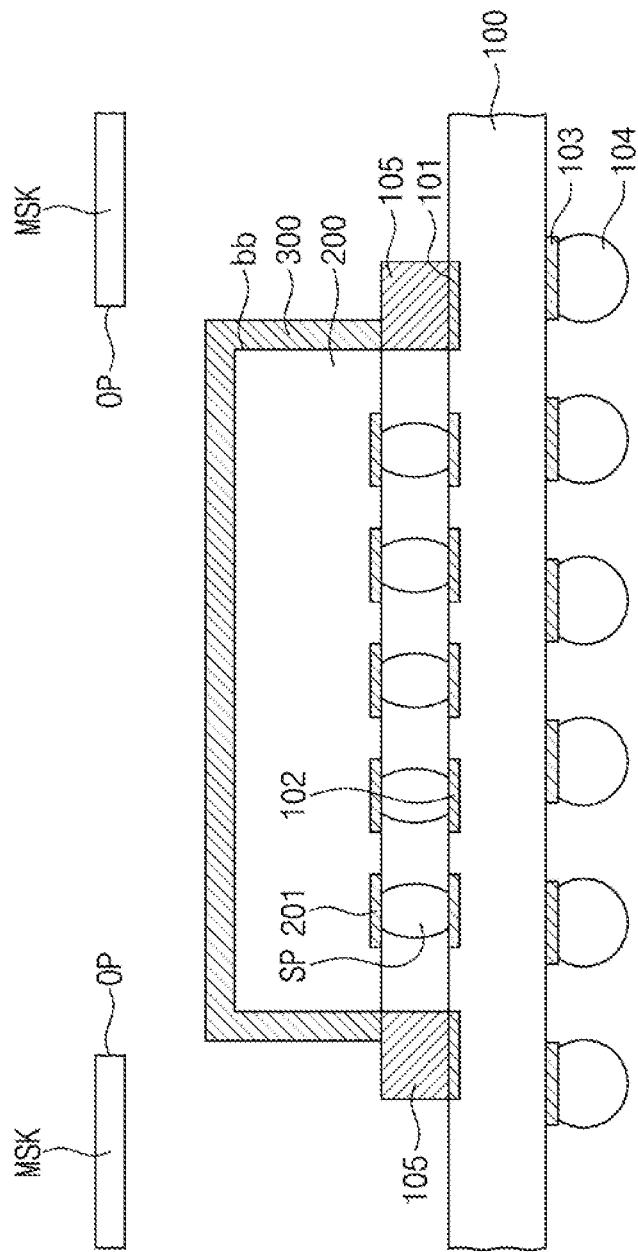

Referring to FIG. 3D, the bumps 202 of the second semiconductor device bb and the bumps 106 of the package substrate 100 may be reflowed to form the connection terminals SP that connect the semiconductor chip 200 to the package substrate 100.

The electromagnetic shield member 300 may be formed on the package substrate 100. The electromagnetic shield member 300 may be formed by a physical vapor deposition (PVD) process in which an electromagnetic shield material is deposited using a mask MSK that has an opening OP through which are exposed an entirety of the semiconductor chip 200 and at least a portion of the conductive member 105.

Referring back to FIG. 1A, the molding member 400 may be formed to cover the electromagnetic shield member 300. The molding member 400 may be formed by forming a molding layer on the package substrate 100 and then performing a singulation process on the molding layer. The molding layer may include, for example, an epoxy molding compound (EMC).

Figure 4:
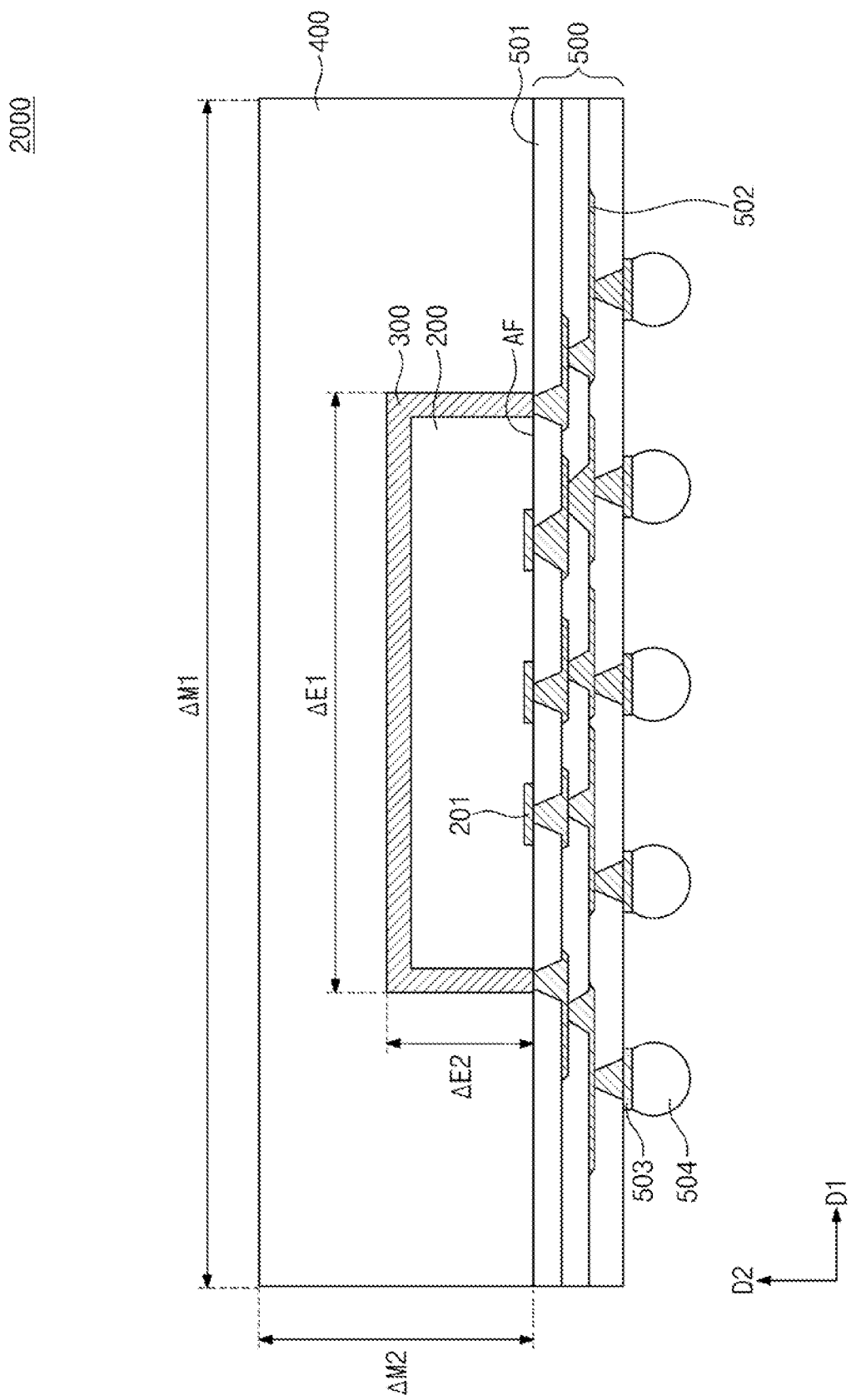
FIG. 4 is a cross-sectional view illustrating a semiconductor package according to some exemplary embodiments of the present inventive concepts.

FIG. 4 is a cross-sectional view illustrating a semiconductor package according to some exemplary embodiments of the present inventive concepts.

Referring to FIG. 4, a semiconductor package 2000, according to some exemplary embodiments of the present inventive concepts, may include a redistribution layer 500, a semiconductor chip 200 on the redistribution layer 500, an electromagnetic shield member 300 that at least partially surrounds the semiconductor chip 200, and a molding member 400 that at least partially surrounds the electromagnetic shield member 300.

The redistribution layer 500 may correspond to the package substrate 100 (e.g., printed circuit board) of FIG. 1A. The redistribution layer 500 may have a structure of a fan-out package.

The redistribution layer 500 may include a plurality of dielectric layers 501 and a plurality of metal patterns 502 that correspondingly penetrate the dielectric layers 501. A plurality of pads 503 may be disposed on a bottom surface of the redistribution layer 500. A plurality of solder balls 504 may be disposed below the redistribution layer 500 and may be in contact with corresponding pads 503.

The semiconductor chip 200 may include a plurality of chip pads 201 on an active surface AF thereof.

The electromagnetic shield member 300 may be electrically connected to one or more of the solder balls 504 through one or more of the metal patterns 502.

The molding member 400 may have a width ΔM1 in a first direction D1 parallel to a top surface of the redistribution layer 500. This width ΔM1 may be greater than a width ΔE1 in the first direction D1 of the electromagnetic shield member 300. The molding member 400 may have a width ΔM2 in a second direction D2 perpendicular to the top surface of the redistribution layer 500. This width ΔM2 may be greater than a width ΔE2 in the second direction D2 of the electromagnetic shield member 300.

FIGS. 5A to 5F illustrate cross-sectional views showing a method of fabricating a semiconductor package according to some exemplary embodiments of the present inventive concepts.

Figure 5A:
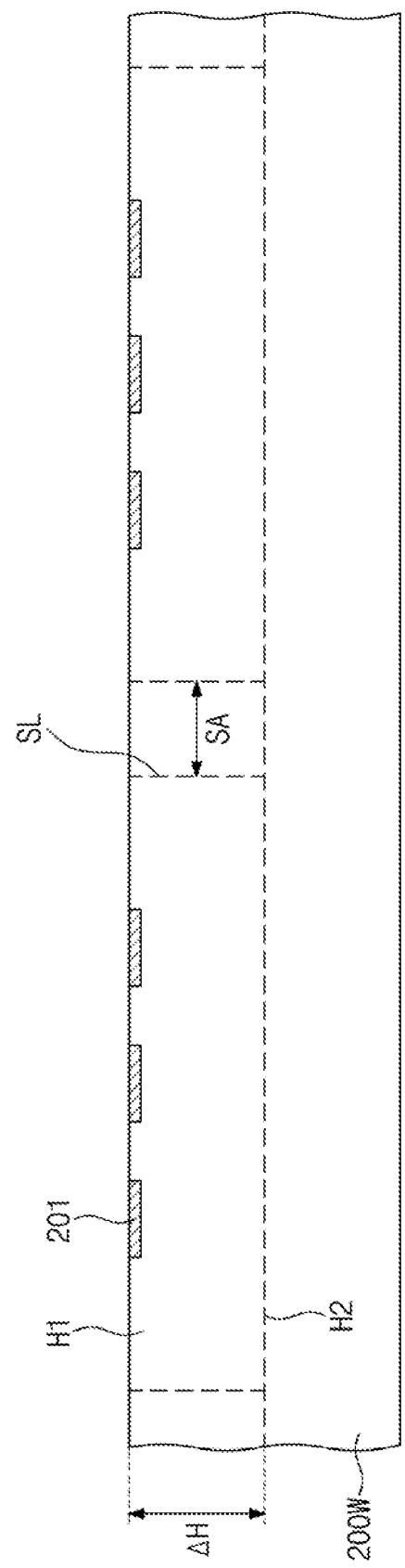
Figure 5B:
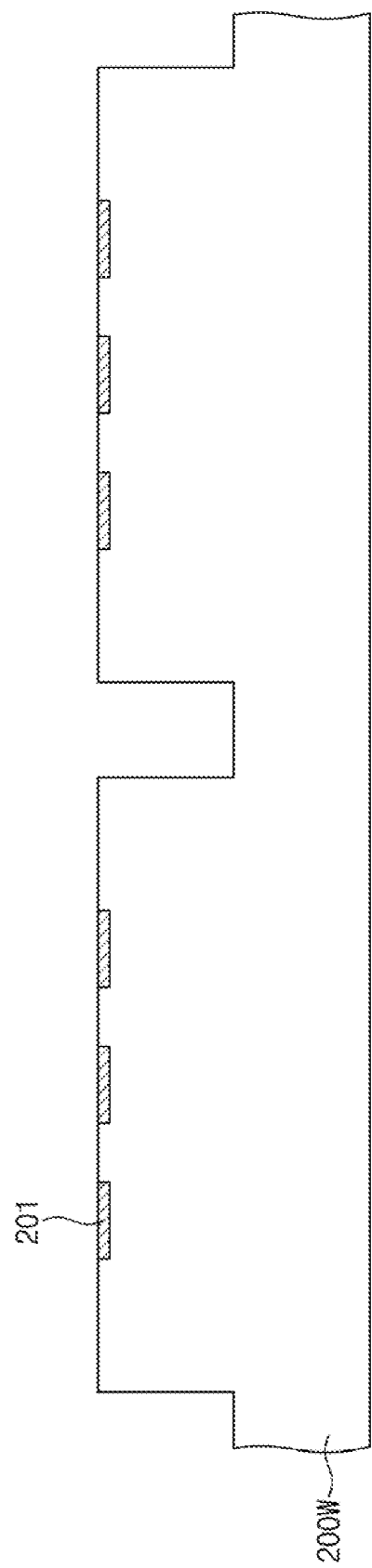

Referring to FIGS. 5A and 5B, sawing may be performed on a wafer 200W having a circuit formed on an upper portion thereof along sawing lines SL. A plurality of chip pads 201 may be disposed on a top surface H1 of the wafer 200W. The sawing SL may continue until is reached a certain depth H2 from the top surface H1 of the wafer 200W. A depth ΔH of the wafer 200W removed by the sawing SL may be, for example, about half of an overall thickness of the wafer 200W. The wafer 200W may have regions including a zone that is subsequently formed into a semiconductor chip 200 which will be discussed below, which regions exclude a sawing area SA of the wafer 200W removed by the sawing SL.

Figure 5D:
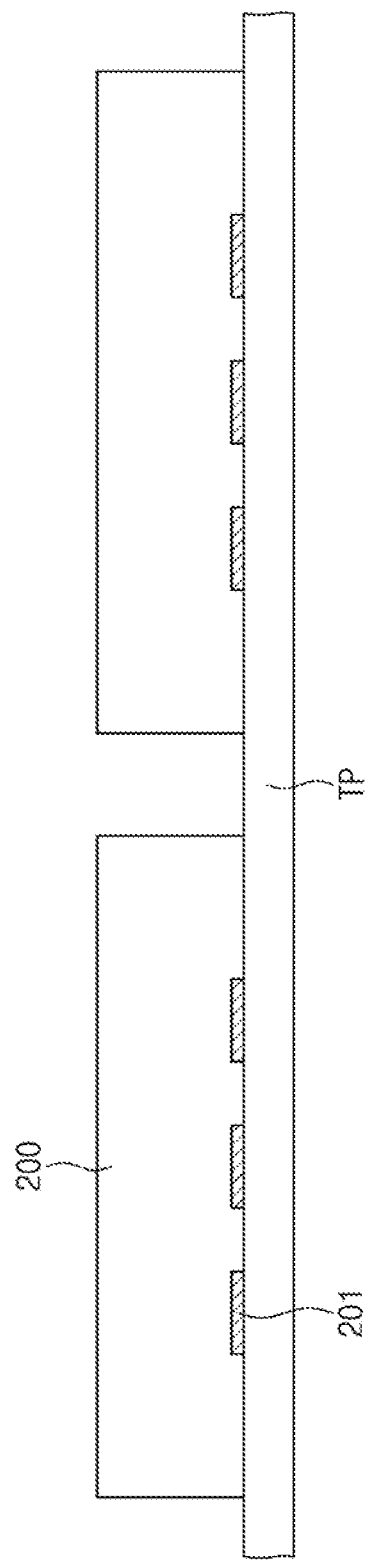

Referring to FIGS. 5C and 5D, a protective tape TP may be attached to the top surface H1 of the wafer 200W. A bottom surface H3 of the wafer 200W may be grinded to form a plurality of semiconductor chips 200. The grinding of the bottom surface H3 of the wafer 200W may reduce a thickness of the wafer 200W. The grinding may continue until a reference line GL along which the wafer 200W is divided into the plurality of semiconductor chips 200. The protective tape TP may prevent damage to the upper portion, on which the circuit is formed, of the wafer 200W when the bottom surface H3 of the wafer 200W is grinded.

Figure 5E:
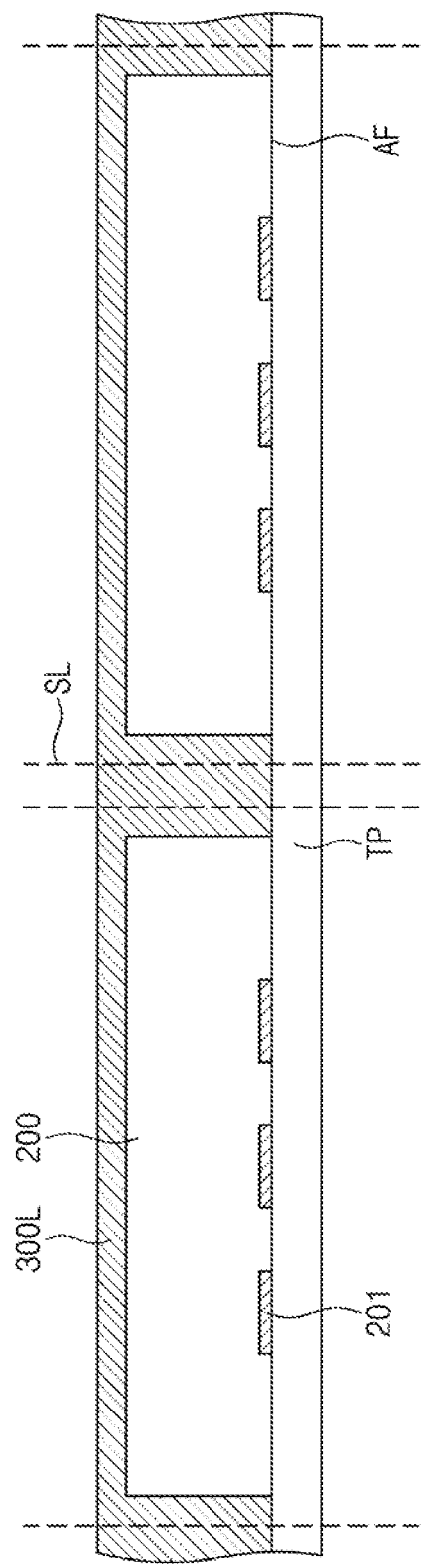

Referring to FIG. 5E, an electromagnetic shield material layer 300L may be formed on a top surface and lateral surfaces of the semiconductor chip 200. The semiconductor chip 200 may be provided with the electromagnetic shield material layer 300L on each of its surfaces other than an active surface AF of the semiconductor chip 200. The electromagnetic shield material layer 300L may connect adjacent semiconductor chips 200. The electromagnetic shield material layer 300L may be deposited by, for example, a spray coating process, an electrolytic plating process, an electroless plating process, a sputtering process, or a physical vapor deposition (PVD) process. For example, a physical vapor deposition (PVD) process may be utilized to deposit the electromagnetic shield material layer 300L. The electromagnetic shield material layer 300L may include a conductive material. The conductive material may include metal, such as copper and/or silver.

The electromagnetic shield material layer 300L may be cut between adjacent semiconductor chips 200, and thus an electromagnetic shield member 300 may be formed. At the same time, the protective tape TP may be cut between the adjacent semiconductor chips 200. As a result, the semiconductor chip 200 may be covered with the electromagnetic shield member 300 on each of its surfaces other than the active surface AF. In consequence, the electromagnetic shield member 300 may be formed in a wafer process step.

Figure 5F:
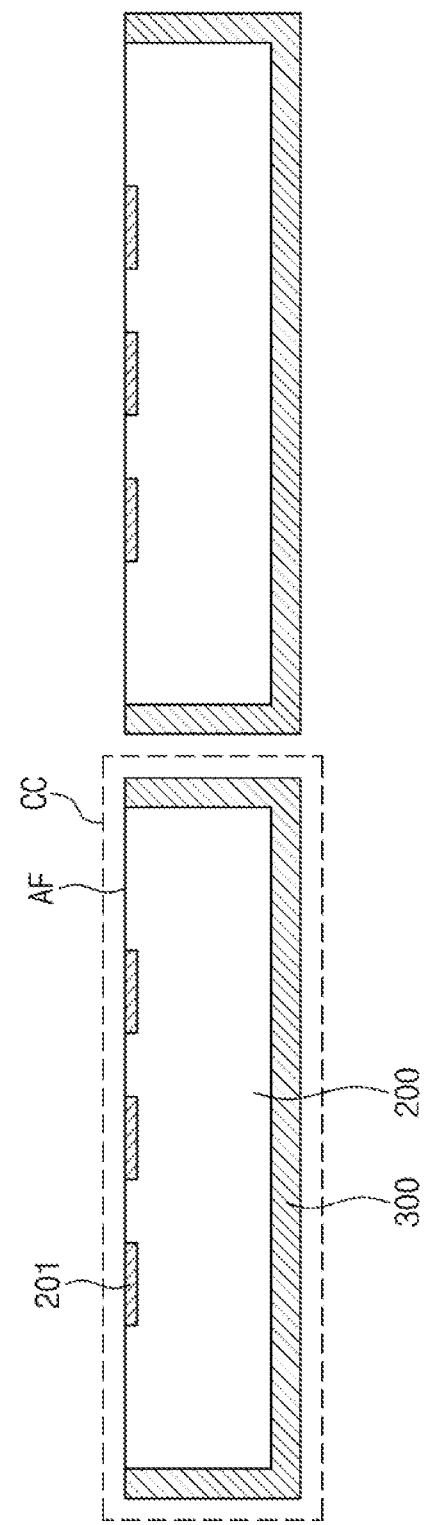

Referring to FIG. 5F, the semiconductor chips 200 may be disposed on a first carrier substrate. The protective tape TP may be removed from the active surfaces AF of the semiconductor chips 200, and thus a third semiconductor device cc may be formed.

Figure 5G:
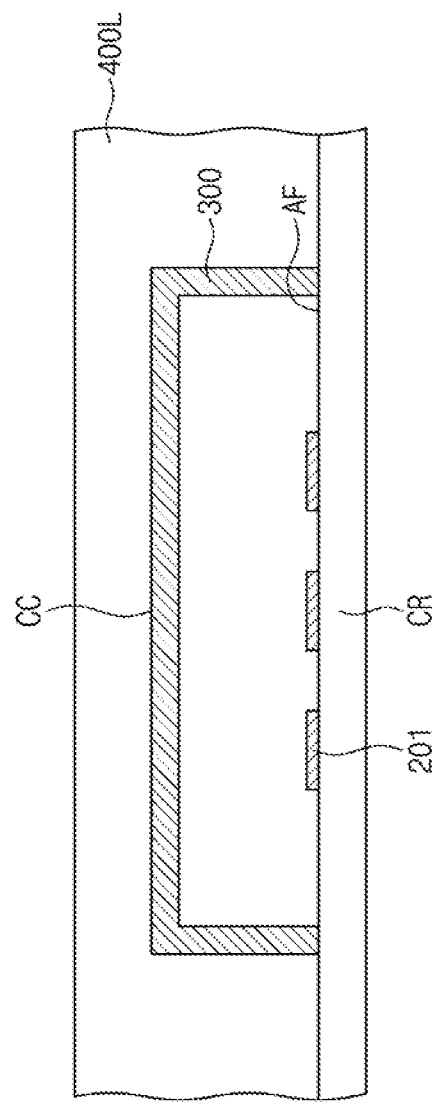

Referring to FIG. 5G, the third semiconductor device cc may be disposed on a second carrier substrate CR. The semiconductor chip 200 may be mounted to allow its active surface AF to face the second carrier substrate CR. A molding layer 400L may be formed to cover the electromagnetic shield member 300. The molding layer 400L may include, for example, an epoxy molding compound (EMC). After the molding layer 400L is formed, the second carrier substrate CR may be removed.

Referring back to FIG. 4, a redistribution layer 500 may be formed on the active surface AF of the semiconductor chip 200. The redistribution layer 500 may be formed by sequentially and repeatedly performing the formation of a dielectric layer 501 and the formation of a metal pattern 502. One or more of the metal patterns 502 may be electrically connected to the electromagnetic shield member 300. After the formation of the redistribution layer 500, a plurality of pads 503 and a plurality of solder balls 504 may be formed.

The redistribution layer 500 and the molding layer 400L may undergo a singulation process to form a molding member 400.

Figure 6:
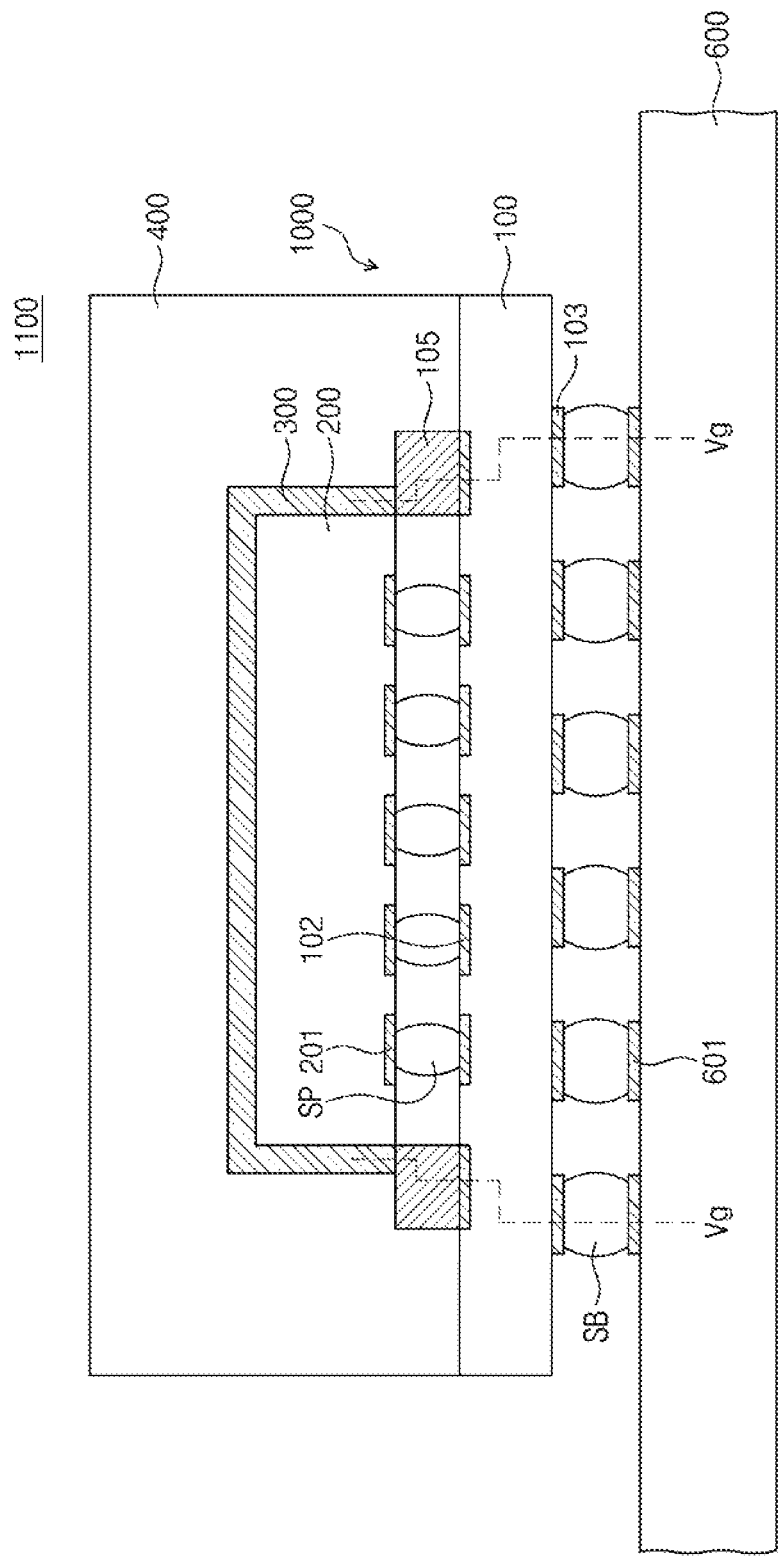
FIG. 6 is a cross-sectional view illustrating a semiconductor apparatus including a semiconductor package according to some exemplary embodiments of the present inventive concepts.

FIG. 6 is a cross-sectional view illustrating a semiconductor apparatus including a semiconductor package according to some exemplary embodiments of the present inventive concepts. Omission will be made to avoid duplicate explanations of the semiconductor package 1000 discussed with reference to FIG. 1A. However, it is to be understood that those elements that have been omitted from FIG. 6 may be at least similar to corresponding elements that have already been described herein.

A semiconductor apparatus 1100 including the semiconductor package 1000, according to some exemplary embodiments of the present inventive concepts, may include a mother board 600, a plurality of pads 601 disposed on the mother board 600, and a plurality of coupling means SB provided between the package substrate 100 and the plurality of pads 601.

The mother board 600 may have a ground circuit Vg formed therein. Electromagnetic waves produced in the semiconductor chip 200 may be absorbed by the electromagnetic shield member 300, and then may flow toward the ground circuit Vg in the mother board 600 through the conductive member 105 electrically connected to the electromagnetic shield member 300. Thus, the electromagnetic waves do not propagate past the electromagnetic shield member 300.

Figure 7:
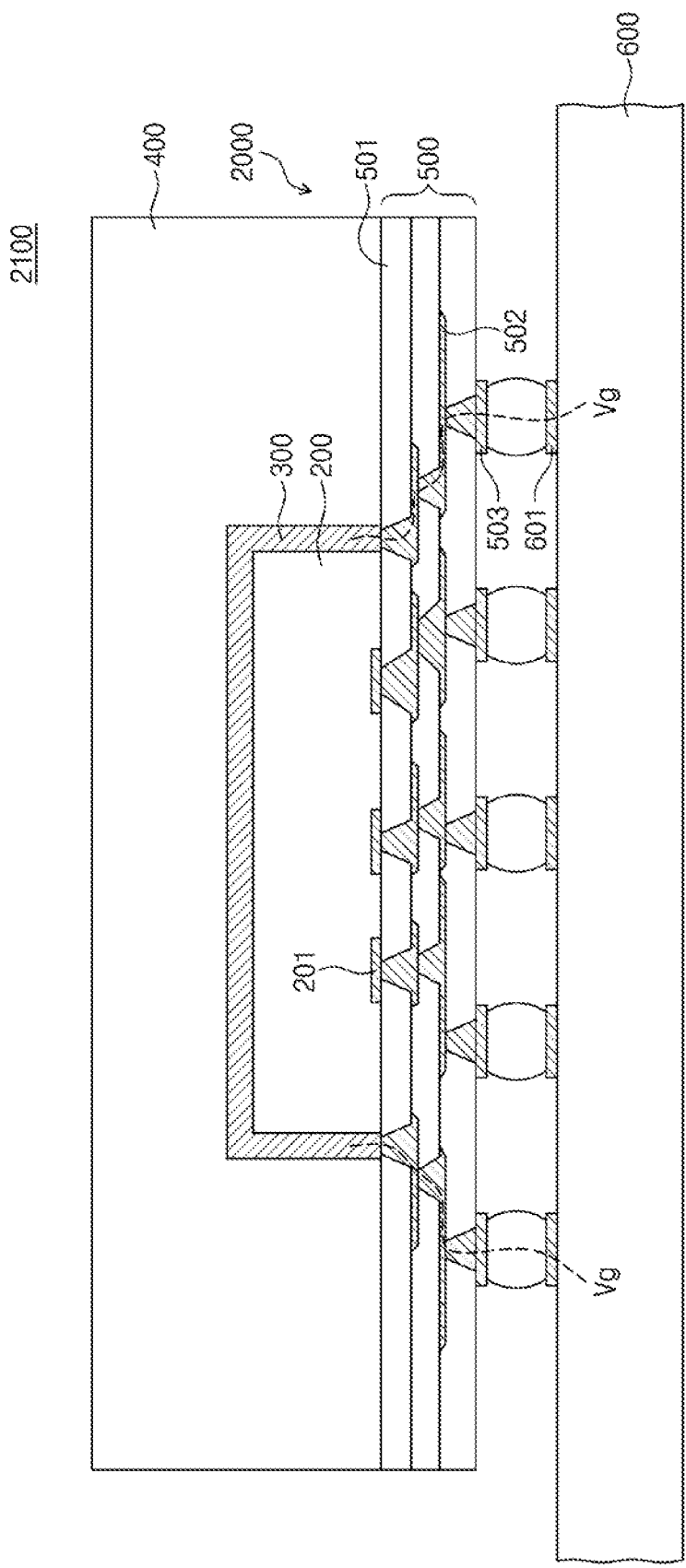
FIG. 7 is a cross-sectional view illustrating a semiconductor apparatus including a semiconductor package according to some exemplary embodiments of the present inventive concepts.

FIG. 7 is a cross-sectional view illustrating a semiconductor apparatus including a semiconductor package according to some exemplary embodiments of the present inventive concepts. Omission will be made to avoid duplicate explanations of the semiconductor package 2000 discussed with reference to FIG. 4. However, it is to be understood that those elements that have been omitted from FIG. 7 may be at least similar to corresponding elements that have already been described herein.

A semiconductor apparatus 2100 including the semiconductor package 2000, according to some exemplary embodiments of the present inventive concepts, may include a mother board 600, a plurality of pads 601 disposed on a top surface of the mother board 600, and a plurality of coupling means SB provided between the package substrate 100 and the plurality of pads 601. The mother board 600 may have a ground circuit Vg formed therein. Electromagnetic waves produced from the semiconductor chip 200 may be absorbed into the electromagnetic shield member 300, and then may flow toward the ground circuit Vg in the mother board 600 through the metal pattern 502 electrically connected to the electromagnetic shield member 300. Thus, the electromagnetic waves do not propagate past the electromagnetic shield member 300.

According to some exemplary embodiments of the present inventive concepts, because an electromagnetic shield member is formed in a wafer level, manufacturing costs may be reduced in comparison with a case where a molding member is formed and thereafter an electromagnetic shield member is formed to cover the molding member. Further, packages may have reduced height compared to products including an electromagnetic shield member that covers the molding member.

In semiconductor packages according to some exemplary embodiments of the present inventive concepts, a package substrate may include a conductive member electrically connected to an electromagnetic shield member, and therefore electromagnetic waves produced from semiconductor chips may be effectively suppressed.

Thus, semiconductor packages and methods of fabricating the same, according to exemplary embodiments of the present inventive concepts, may be used to effectively shield electromagnetic waves and to decrease process costs.

Although the present invention has been described in connection with the some exemplary embodiments of the present inventive concepts illustrated in the accompanying drawings, it will be understood by one of ordinary skill in the art that variations in form and detail may be made therein without departing from the spirit and essential feature of the present inventive concepts.

What is claimed is:

1. A semiconductor package, comprising:
   a redistribution layer;
   a semiconductor chip disposed on the redistribution layer;
   an electromagnetic shield at least partially covering the semiconductor chip; and
   a molding at least partially covering the electromagnetic shield,
   wherein the redistribution layer includes a dielectric layer and metal pattern penetrating the dielectric layer,
   wherein the electromagnetic shield is electrically connected to the metal pattern,
   wherein the electromagnetic shield contacts an upper surface and side surfaces of the semiconductor chip, and
   wherein the molding is spaced apart from the semiconductor chip with the electromagnetic shield interposed therebetween.

2. The semiconductor package of claim 1, wherein the electromagnetic shield is electrically connected through the metal pattern to a ground terminal below the redistribution layer.

3. The semiconductor package of claim 1, wherein the electromagnetic shield is in contact with the metal pattern.

4. The semiconductor package of claim 1, wherein the molding and the electromagnetic shield each have a width in a first direction parallel to the top surface of the redistribution layer, the width in the first direction of the molding is greater than the width in the first direction of the electromagnetic shield, the molding and the electromagnetic shield have a width in a second direction perpendicular to the top surface of the redistribution layer, and the width in the second direction of the molding is greater than the width in the second direction of the electromagnetic shield.

5. A semiconductor package, comprising:
   a redistribution layer;
   a semiconductor chip disposed on the redistribution layer;
   an electromagnetic shield at least partially covering the semiconductor chip; and
   a molding at least partially covering the electromagnetic shield,
   wherein the redistribution layer includes a dielectric layer and metal pattern penetrating the dielectric layer,
   wherein the semiconductor chip includes active surface and a plurality of chip pads on the active surface,
   wherein the electromagnetic shield is electrically connected to the metal pattern, and wherein the chip pads are in contact with the metal pattern.

6. The semiconductor package of claim 5, wherein the electromagnetic shield contacts an upper surface and side surfaces of the semiconductor chip.

7. The semiconductor package of claim 5, wherein the molding is spaced apart from the semiconductor chip with the electromagnetic shield interposed therebetween.

8. The semiconductor package of claim 5, wherein the molding and the electromagnetic shield each have a width in a first direction parallel to the top surface of the redistribution layer, the width in the first direction of the molding is greater than the width in the first direction of the electromagnetic shield, the molding and the electromagnetic shield have a width in a second direction perpendicular to the top surface of the redistribution layer, and the width in the second direction of the molding is greater than the width in the second direction of the electromagnetic shield.

9. A semiconductor package, comprising:
a redistribution layer;
a semiconductor chip disposed on the redistribution layer;
an electromagnetic shield at least partially covering the semiconductor chip; and
a molding at least partially covering the electromagnetic shield,
wherein the redistribution layer includes a dielectric layer and metal pattern penetrating the dielectric layer,
wherein the electromagnetic shield is electrically connected to the metal pattern wherein the semiconductor chip includes chip pads connected to the metal pattern, and
wherein a level of a lowermost portion of the electromagnetic shield is equal to a level of a lowermost portion of each of the chip pads.

10. The semiconductor package of claim 9, wherein the electromagnetic shield contacts an upper surface and side surfaces of the semiconductor chip.

11. The semiconductor package of claim 9, wherein the molding is spaced apart from the semiconductor chip with the electromagnetic shield interposed therebetween.

12. The semiconductor package of claim 9, wherein the molding and the electromagnetic shield each have a width in a first direction parallel to the top surface of the redistribution layer, the width in the first direction of the molding is greater than the width in the first direction of the electromagnetic shield, the molding and the electromagnetic shield have a width in a second direction perpendicular to the top surface of the redistribution layer, and the width in the second direction of the molding is greater than the width in the second direction of the electromagnetic shield.

* * * * *